(12) United States Patent
Monh et al.

(10) Patent No.: US 7,876,564 B2
(45) Date of Patent: Jan. 25, 2011

(54) METHOD AND APPARATUS FOR COOLING COMPUTER MEMORY

(75) Inventors: Mohasit Monh, Saratoga, CA (US); Ryan Petersen, San Jose, CA (US)

(73) Assignee: CCZ Technology Group, Inc., San Jose, CA (US)

( * ) Notice: Subject to any disclaimer, the term of this patent is extended or adjusted under 35 U.S.C. 154(b) by 57 days.

(21) Appl. No.: 12/127,133

(22) Filed: May 27, 2008

(65) Prior Publication Data

US 2008/0291630 A1 Nov. 27, 2008

Related U.S. Application Data

(60) Provisional application No. 60/940,155, filed on May 25, 2007.

(51) Int. Cl.
*H05K 7/20* (2006.01)
*H01L 23/34* (2006.01)
*F28F 7/00* (2006.01)

(52) U.S. Cl. .................. 361/700; 361/715; 257/714; 174/15.2; 165/80.4; 165/80.5; 165/104.33

(58) Field of Classification Search ................ 361/699, 361/700, 715; 257/714; 174/15.2; 165/80.4–80.5, 165/104.33
See application file for complete search history.

(56) References Cited

U.S. PATENT DOCUMENTS

| | | | |
|---|---|---|---|
| 6,775,139 B2 * | 8/2004 | Hsueh | .................. 361/697 |
| 6,906,919 B2 | 6/2005 | Pokharna et al. | |
| 7,106,595 B2 | 9/2006 | Foster, Sr. et al. | |
| 7,151,668 B1 * | 12/2006 | Stathakis | ................ 361/700 |
| 2004/0069459 A1 | 4/2004 | Tonosaki et al. | |
| 2005/0088820 A1 | 4/2005 | Naganawa et al. | |
| 2006/0056154 A1 * | 3/2006 | Foster et al. | .............. 361/700 |
| 2006/0146497 A1 * | 7/2006 | Gauche et al. | ............. 361/701 |
| 2008/0251911 A1 * | 10/2008 | Farnsworth et al. | ........ 257/714 |
| 2008/0264613 A1 * | 10/2008 | Chu | ................. 165/104.33 |
| 2009/0168356 A1 * | 7/2009 | Chen et al. | ................. 361/709 |

* cited by examiner

*Primary Examiner*—Zachary M Pape
(74) *Attorney, Agent, or Firm*—Hartman & Hartman, P.C.; Gary M. Hartman; Domenica N. S. Hartman

(57) ABSTRACT

A method and apparatus for cooling chips on a computer memory module. The apparatus includes a primary and secondary heat spreaders, at least a first heatpipe coupled to the primary heat spreader and having a remote portion spaced apart from the primary heat spreader and thermally contacting the secondary heat spreader, and a coolant within the first heatpipe and the primary heat spreader so as to absorb heat from the primary heat spreader and conduct the heat to the secondary heat spreader. The primary heat spreader has at least two panels configured to engage the memory module therebetween, with facing contact surfaces of the panels adapted for thermal contact with the module chips. The secondary heat spreader is configured to increase surface dissipation of heat from the first heatpipe into the environment. The coolant has a boiling point at or below a maximum preselected operating temperature of the module chips.

15 Claims, 1 Drawing Sheet

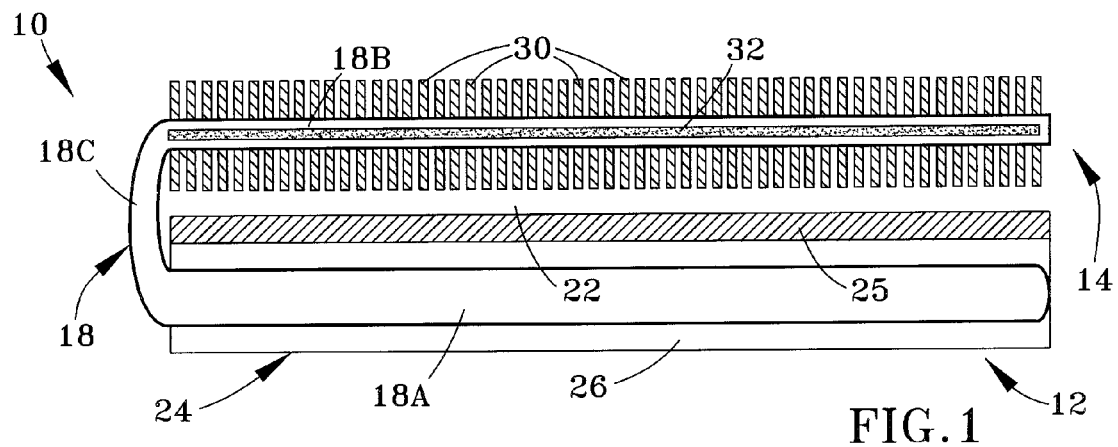
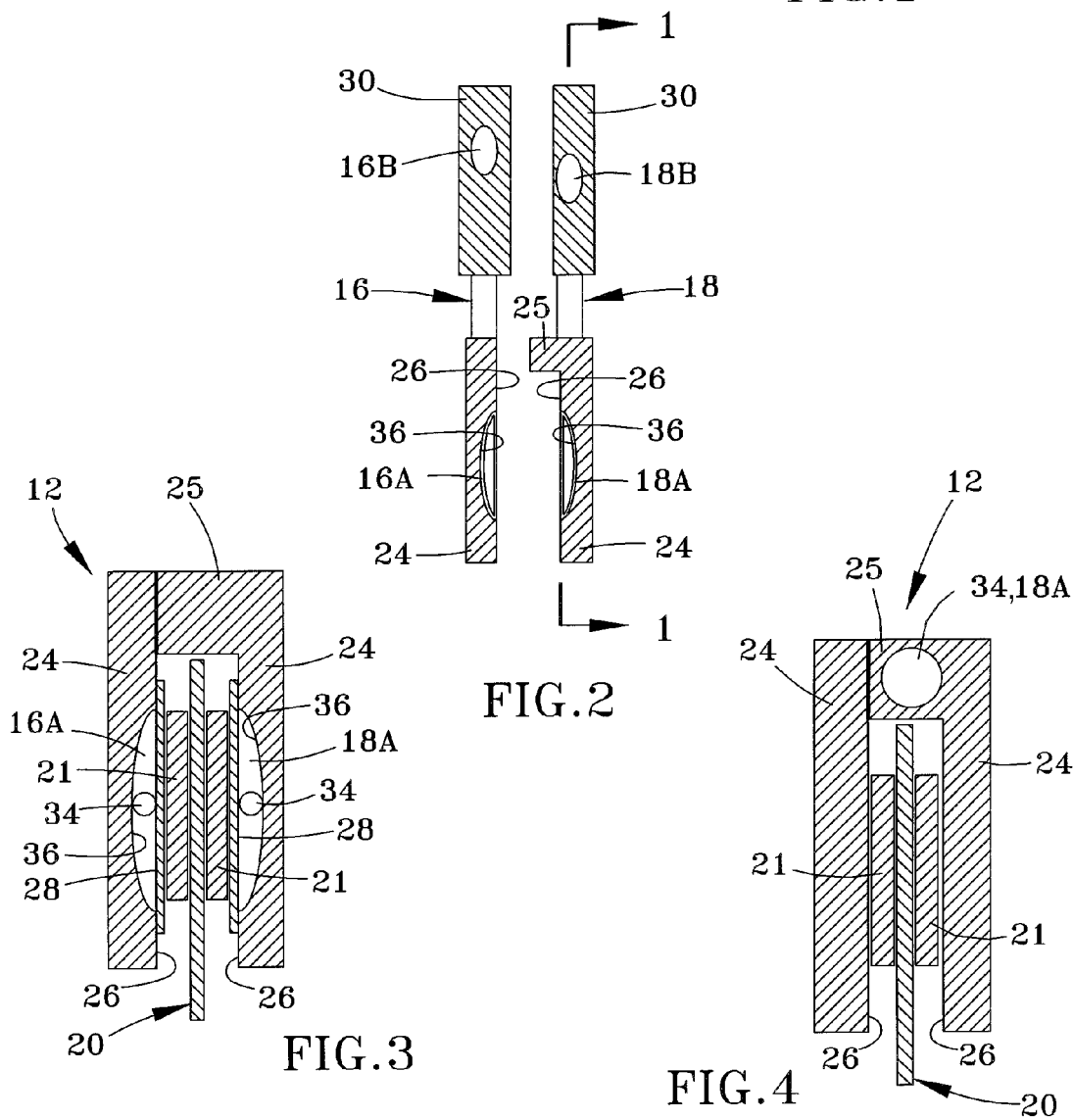

METHOD AND APPARATUS FOR COOLING COMPUTER MEMORY

CROSS REFERENCE TO RELATED APPLICATIONS

This application claims the benefit of U.S. Provisional Application No. 60/940,155, filed May 25, 2007, the contents of which are incorporated herein by reference.

BACKGROUND OF THE INVENTION

The present invention generally relates to methods, apparatuses, and devices for cooling high-power density electronics, including but not limited to memory modules of computers. More particularly, this invention relates to cooling methods, apparatuses, and devices that utilize a heatpipe to cool a computer memory module.

Computer memory has evolved from a small number of integrated memory chips to a multi-module subsystem. Aside from the increased footprint, the power consumption of system memory has also increased far beyond the levels found in legacy memory solutions. A prominent role in the overall power consumption of a system memory module is played by the actual mode of operation or state of the Dynamic Random Access Memory (DRAM) chips on the module. For example, in no-operation situations in which no transactions occur and only the memory internal clocks are running, the power consumption is only a fraction of that during a four-way interleaved read, during which data are streamed out into the bus from all four internal banks of the memory components. With every generation of double data rate (DDR) memory, the number of prefetched bits is also increasing (for example, DDR3 currently prefetches eight bits on every access), which extends the minimum data that are output on the bus during each burst. Any mandatory increase in the burst length increases the number of total transactions and, therefore, the power needed for sustaining them. This escalation of power has evolved into a limitation of the maximum number of bursts within a defined time window (tFAW) for the purpose of thermal relaxation under full load.

Historically, only the Rambus DRAM memory technology (Rambus, Inc.) had a power consumption high enough to thermally challenge the DRAM components. This was counteracted by supplying heat spreaders for the DRAM components, whereas SDRAM and later DDR modules were primarily built without any thermal management add-ons. In the enthusiast market, heat spreaders for memory were introduced in 2001 by Mushkin Enhanced Memory Systems and, concurrently, by Thermaltake as an original equipment manufacturer for a number of enthusiast memory suppliers. However, modern memory with increasing clock frequencies can incur power consumption and heat dissipation in excess of that found only a few years ago in commodity memory systems. As a result, heat spreaders are becoming more and more common and are becoming part of the DRAM standard, at least to the point where their presence or absence is catalogued in the module's electronic data sheet, namely, the serial presence detect (SPD) read-only memory (ROM) on the module.

An inherent drawback of conventional memory heat spreaders is that their physical size does not exceed that of the memory module; as a result, while small hot-spots are dissipated over an increased surface, the overall dissipation area of the heat spreader is not increased compared to the module itself. Thermal dissipation is, however, limited by the radiator surface area and the temperature delta to the environment. Therefore, presuming a constant environmental temperature, the only way to lower the source temperature is to increase the radiator area size. However, within the confined space available for each memory module on a motherboard, passive heat conductance across a solid structure becomes the primary limitation for moving heat away from its source. It is clear, therefore, that an active removal of heat from the memory would be highly beneficial for its thermal management.

In cooling solutions for central processors (CPU) and graphics processors (GPU), as well as other high power density electronics, heatpipe technology has been used for several years. Heatpipes operate based on the principle of using a pipe filled with water (or another suitable coolant) under partial vacuum conditions. The partial vacuum within the pipe can be selected to lower the boiling point of the water to a desired temperature. At any location within the pipe at which the desired temperature is exceeded, the water will boil and, in the process of changing from the liquid to the gaseous (vapor) phase, absorb heat energy. The resultant vapor rises within the heatpipe and typically condenses at a remote end of the pipe. Condensation can be promoted with a wick or a sintered porous surface within the pipe that increases the condensation surface and capillary action, thereby promoting the return of liquid water to the heat source.

As memory modules have become more thermally challenged due to increased power consumption, the design of the memory subsystem on most motherboards has changed little to accommodate much in terms of thermal management solutions because of space constraints. The high operating frequencies of high performance memory modules are particularly affected since the power consumption increases with frequency, and to achieve higher frequencies the voltage often must also be raised. Higher power consumption increases the junction temperature on the memory die, which in turn slows down signal propagation along the interconnect of the memory die, thereby reducing the maximum attainable frequency of the memory and potentially increasing the error rate.

In view of the above, in high performance memory modules, and particularly those using increased supply voltage, thermal management is becoming a crucial aspect of overall performance. Because of the limited space between memory modules, the cross-sectional area of any heat-dissipating device must be very small, exacerbating the limitations of passive cooling techniques. Furthermore, transferring heat to fins is similarly hampered by the same limitations of the fin design and passive conductance limitations. A solution to this aspect of the problem has been to use active cooling techniques, for example, forced water cooling. However, forced water cooling is not practical for all implementations, especially since it requires a considerable amount of additional equipment, for example, radiators, tubing and pumps.

BRIEF SUMMARY OF THE INVENTION

The present invention provides a method and apparatus suitable for cooling high-power density electronics, such as individual memory modules of a computer whose memory chips have maximum preselected operating temperatures.

According to a first aspect of the invention, the apparatus includes a primary heat spreader, at least a first heatpipe coupled to the primary heat spreader and having a remote portion spaced apart from the primary heat spreader, a secondary heat spreader in thermally conductive contact with the remote portion of the first heatpipe and spaced apart from the primary heat spreader so as to define an air gap therebetween, and a coolant within the first heatpipe and the primary heat spreader so as to absorb heat from the primary heat spreader and conduct the absorbed heat to the secondary heat spreader. The primary heat spreader comprises at least two panels configured to engage the memory module therebetween. The panels have contact surfaces adapted for thermal contact with the memory chips of the computer memory module, and are connectable with each other such that the contact surfaces thereof face each other. The secondary heat spreader comprises means for increasing surface dissipation of heat from the first heatpipe into the environment. The coolant has a boiling point at or below the maximum preselected operating temperature of the at least one memory chip.

According to a second aspect of the invention, the apparatus is installed on the memory module so that the memory module and the chips thereof are between the contact surfaces of the panels and at least one of the chips is contacted by at least one of the contact surfaces. A third aspect of the invention is a method by which the apparatus is installed on the memory module.

In view of the above, it can be seen that the invention utilizes a coolant-containing heatpipe embedded into a primary heat spreader adapted for mounting on a memory module, such that heat is transferred transfer from chips on the module to the heatpipe. The heatpipe then extends into a secondary heat spreader, where any coolant that has vaporized as a result of heating by the chips condenses. The resultant phase change from vapor to liquid phase dissipates heat to the secondary heat spreader, from which the heat is transferred to the surrounding environment. The secondary heat spreader is preferably positioned above the primary heat spreader and the memory module, thereby creating an air channel between the primary and secondary heat spreaders. The secondary heat spreader is preferably configured to have increased surface area and create turbulence in the air channel that reduces laminar flow and promotes heat transfer to the environment.

In short, advantages of the invention can be briefly summarized to include the use of heatpipe technology to provide efficient phase change-based heat absorption from a memory module and heat release from the secondary heat spreader, good thermal contact for maximizing heat transfer from the memory module to the heatpipe through the primary heat spreader, and placement of the secondary heat spreader to maximize thermal dissipation to the environment.

Other objects and advantages of this invention will be better appreciated from the following detailed description.

BRIEF DESCRIPTION OF THE DRAWINGS

FIG. 1 represents a longitudinal cross-section of a cooling apparatus comprising primary and secondary heat spreaders connected by heatpipes in accordance with a first embodiment of the invention.

FIG. 2 represents a transverse cross-section of the cooling apparatus of FIG. 1.

FIG. 3 represents a transverse cross-section of a primary heat spreader installed on a computer memory module and configured in accordance with a second embodiment of the invention.

FIG. 4 represents a transverse cross-section of a primary heat spreader installed on a computer memory module and configured in accordance with a third embodiment of the invention.

DETAILED DESCRIPTION OF THE INVENTION

The present invention provides a thermal management solution that utilizes at least one heatpipe for cooling modules of a computer system memory. The heatpipe is directly attached to a primary heat spreader that preferably is in direct thermal contact with memory chips on a memory module to absorb heat from the chips. The heatpipe is configured to make close thermal contact with the primary heat spreader, and contains water in a partial vacuum to lower the boiling point of the water to approximately or below the maximum operating temperature identified for at least one of the memory chips, for example, based on a maximum junction temperature for the memory chips that if exceeded would slow down signal propagation along the interconnect of the memory die, thereby reducing the maximum attainable frequency of the memory and potentially increasing the error rate. Alternatively, a different coolant could be chosen whose boiling temperature is approximately the highest operating temperature desired for the memory chips. In either case, the coolant within the heatpipe evaporates if the targeted maximum operating temperature is reached. The heatpipe terminates at an elevated remote end outside of the primary heat spreader, and preferably within a secondary heat spreader spaced apart from and above the primary heat spreader. The secondary heat spreader is exposed to forced or natural convection airflow conditions, which causes heat to be dissipated from the remote end of the heatpipe into the surrounding environment. By this process, the temperature of the heatpipe can be reduced below the condensation point of the coolant within the partial vacuum of the pipe, causing the coolant to condense and flow back to the heatpipe within the primary heat spreader. A wick can be provided within the heatpipe to promote the condensation of the coolant vapor, as well as conduct heat from the coolant to the walls of the pipe. The phase change from the gaseous to the liquid phase increases the surface temperature of the secondary heat spreader, thereby increasing the heat transfer rate from the secondary heat spreader to the environment.

FIGS. 1 through 4 depict configurations of the invention. In these figures, consistent reference numbers are used to identify functionally similar structures. FIGS. 1 and 2 represent a first embodiment of a cooling apparatus 10 incorporating the above-noted functional aspects desired of this invention. The apparatus 10 comprises a primary heat spreader 12, a secondary heat spreader 14, and a pair of heatpipes 16 and 18 that physically and thermally interconnect the primary and secondary heat spreaders 12 and 14. When installed on a memory module 20 (FIGS. 3 and 4), each heatpipe 16 and 18 has a lower portion 16A and 18A within the primary heat spreader 12 and an upper remote portion 16B and 18B within the secondary heat spreader 14. As evident from FIGS. 1 and 2, the cross-sectional shapes of the lower and remote portions 16A, 18A, 16B, and 18B may differ, though their cross-sectional areas may be roughly the same. In FIGS. 1 and 2, each heatpipe 16 and 18 is generally U-shaped and has a curvilinear portion 16C and 18C connecting its substantially linear lower portion 16A and 18A to its substantially linear remote portion 16B and 18B. An airspace 22 is present between the lower portions 16A and 18A and the remote portions 16B and 18B of the heatpipes 16 and 18, as well as between the primary and secondary heat spreaders 12 and 14 coupled thereto.

The primary heat spreader 12 comprises a pair of panels 24 adapted to be secured together with the memory module 20 clamped or otherwise secured therebetween. One of the panels 24 is represented as having a shoulder 25 sized to bridge the distance defined by the thickness of the chips 21 and the module 20, as seen in FIGS. 3 and 4. Any suitable means (not shown) can be used to secure the panels 24, including fasteners, springs, clips, solder, braze alloys, adhesives, etc. Furthermore, it is foreseeable that the panels 24 could be machined, molded, or otherwise formed as leg structures of a unitary component. As evident from FIGS. 3 and 4, the panels 24 of the primary heat spreader 12 can have substantially the same length and height dimensions as the memory module 20 on which it is installed. The lower portions 16A and 18A of the heatpipes 16 and 18 are shown as being defined in facing contact surfaces 26 of the panels 24. As represented in FIGS. 1 and 2, the lower portions 16A and 18A of the pipes 16 and 18 can be portions of tubes that define the remote and curvilinear portions 16B, 18B, 16C and 18C of the heatpipes 16 and 18, which are deformed and bonded to fit within grooves 36 machined in the panel surfaces 26. Alternatively, FIG. 3 (depicting only the primary heat spreader 12) shows the lower portions 16A and 18A of the heatpipes 16 and 18 as not being extensions of the tubes that define the remote and curvilinear portions 16B, 18B, 16C and 18C of the heatpipes 16 and 18, but instead are defined by machined grooves 36 to which the pipes 16 and 18 are fluidically connected, in which case the machined grooves 36 are closed with plates 28 or any other suitable means that can be soldered or otherwise bonded to the contact surfaces 26 of the panels 24. Because the contact surfaces 26 are preferably flat in order to provide good thermal contact with the chips 21, the lower portions 16A and 18A are represented in FIGS. 2 and 3 as generally D-shaped in cross-section. In the embodiment of FIG. 3, ends of the pipes 16 and 18 can be individually inserted into bores 34 defined in the panels 24 of the primary heat spreader 12. The pipes 16 and 18 and their bores 34 can be configured to form sealed joints that allow the pipes 16 and 18 to rotate relative to the primary heat spreader 12, thereby enabling the position of each remote portion 16B and 18B of the secondary heat spreader 14 to be adjusted relative to the primary heat spreader 12. Chips 21 on the memory module 20 are directly contacted by, depending on the embodiment, either the pipes 16 and 18 or the plates 28 to provide a direct thermal path from the chips 21 to the coolant within the pipes 16 and 18.

The secondary heat spreader 14 preferably occupies space directly above the memory module 20 on which the primary heat spreader 12 is installed, as can be visualized from comparing FIGS. 2, 3 and 4. The secondary heat spreader 14 comprises at least one and preferably two rows of fins 30 through which the remote portions 16B and 18B of the pipes 16 and 18 pass. The fins 30 provide increased surface area exposed to the environment, which in a typical computer enclosure contains an air stream moved by fans within the enclosure. FIG. 1 represents the use of wicks 32 (one of which is visible) disposed within the remote portions 16B and 18B of the pipes 16 and 18. The wicks 32 promote the condensation of the coolant vapor within the remote portions 16B and 18B and, through capillary action, promote the return of liquified coolant to the lower portions 16A and 18A of the pipes 16 and 18 within the primary heat spreader 12. As a result of physical contact between the wicks 32 and their respective heatpipes 16 and 18, the wicks 32 also promote thermal conduction from the coolant to the walls of the pipes 16 and 18. The wicks 32 can be formed of a variety of materials well known in the art, and can have any number of physical configurations. Alternatively or in addition, the internal surfaces of the pipes 16 and 18 could be roughened or have a sintered porous surface coating to increase surface condensation and capillary action.

Various materials can be used to fabricate the heatpipes 16 and 18, panels 24, fins 30, and other components of the apparatus 10, including but not limited to copper, aluminum, beryllium oxide, thermally conductive carbon, and other thermally conductive structural materials.

As discussed previously, each heatpipe 16 and 18 absorbs heat directly from the chips 21 on the memory module 20. When coolant (e.g., water) within the lower portions 16A and 18A of the pipes 16 and 18 evaporates due to heating by the chips 21, the resultant coolant vapor rises and enters the elevated remote portions 16B and 18B of the pipes 16 and 18 within the secondary heat spreader 14, where the fins 30 dissipate heat from the pipes 16 and 18 into the surrounding environment. As a result, the temperatures of the remote portions 16B and 18B are reduced below the condensation point of the coolant, causing the coolant to condense and flow back to the lower portions 16A and 18A of the pipes 16 and 18 within the primary heat spreader 12.

In FIG. 4, the primary heat spreader 12 is represented as modified to have a single heatpipe 18 whose lower portion 18A is connected to or passes through a bore 34 defined in the shoulder 25 of the righthand panel 24. As with the embodiment of FIG. 3, the pipe 18 of FIG. 4 can be connected to the primary heat spreader 12 with a sealed joint that allows the pipe 18 to rotate relative to the primary heat spreader 12. Other than the use of a single heatpipe 18 and, as a practical but not necessary consequence, a single remote pipe portion attached to a single row of fins (not shown), the function of the cooling apparatus 10 is essentially the same as that of the preceding embodiments of the invention. However, heat transfer is no longer essentially directly from the chips 21 to the heatpipe 18, and instead heat must be conducted through the panels 24 to the heatpipe 18.

While the invention has been described in terms of specific embodiments, it is apparent that other forms could be adopted by one skilled in the art. For example, the physical configuration of the apparatus 10 and its components could differ from those shown, and materials and processes other than those noted could be used. Therefore, the scope of the invention is to be limited only by the following claims.

The invention claimed is:

1. A cooling apparatus for a computer memory module comprising a substrate with memory chips on at least one surface thereof, at least one of the memory chips having a maximum preselected operating temperature, the cooling apparatus comprising:

a primary heat spreader having a longitudinal extent and comprising separate and discrete first and second panels configured to engage the memory module therebetween by assembling and securing the first and second panels together, the first and second panels having contact surfaces that face each other when the first and second panels are assembled and secured together and are adapted for thermal contact with the at least one memory chip of the computer memory module when the first and second panels are assembled and secured together with the computer memory module therebetween;

at least a first heatpipe fluidically coupled to the first panel of the primary heat spreader and having a remote portion alongside the first panel so as to be oriented substantially parallel to and spaced apart from the primary heat spreader in a lateral direction relative to the longitudinal extent of the primary heat spreader;

a secondary heat spreader in thermally conductive contact with the remote portion of the first heatpipe and spaced apart from the primary heat spreader so as to define an air gap therebetween, the secondary heat spreader comprising means for increasing surface dissipation of heat from the first heatpipe into the environment; and a coolant within the first heatpipe and within the primary heat spreader so as to absorb heat from the primary heat spreader while the coolant is within the first panel and conduct the absorbed heat to the secondary heat spreader by flowing from the first panel through the first heatpipe to the remote portion thereof, the coolant having a boiling point at or below the maximum preselected operating temperature of the at least one memory chip;

wherein the first heatpipe is fluidically coupled to a fluid-tight passage within the first panel of the primary heat spreader, and the passage has a wall that defines at least a portion of the contact surface of the first panel and thermally contacts the at least one memory chip of the computer memory module when the first and second panels are assembled and secured together with the computer memory module therebetween; and wherein the wall of the passage is a plate bonded to the first panel so as to close the passage and has a flat surface that defines the portion of the contact surface of the first panel.

2. The cooling apparatus according to claim 1, wherein the primary and secondary heat spreaders are formed of at least one material chosen from the group consisting of copper, aluminum, beryllium oxide, and thermally conductive carbon.

3. The cooling apparatus according to claim 1, wherein the first panel and the remote portion of the first heatpipe define a structure that is substantially U-shaped.

4. The cooling apparatus according to claim 1, wherein the surface dissipation means of the secondary heat spreader comprises fins oriented transverse to the remote portion of the first heatpipe.

5. The cooling apparatus according to claim 1, wherein the first heatpipe is rotatably attached to the first panel of the primary heat spreader.

6. The cooling apparatus according to claim 1, further comprising at least a second heatpipe coupled to the second panel of the primary heat spreader and having a remote portion alongside the second panel so as to be substantially parallel to and laterally spaced apart a substantially uniform distance from the primary heat spreader.

7. The cooling apparatus according to claim 6, further comprising a second secondary heat spreader in thermally conductive contact with the remote portion of the second heatpipe and spaced apart from the primary heat spreader so as to define an air gap therebetween, the second secondary heat spreader comprising means for increasing surface dissipation of heat from the second heatpipe into the environment.

8. The cooling apparatus according to claim 1, wherein the first and second panels are assembled and secured together and the cooling apparatus is installed on the memory module so that the memory module and the chips thereof are between the contact surfaces of the first and second panels and at least one of the chips is contacted by at least one of the contact surfaces.

9. A method of cooling a computer memory module, the method comprising installing the cooling apparatus of claim 1 on the memory module by assembling and securing the first and second panels together so that the memory module and the chips thereof are between the contact surfaces of the first and second panels and at least one of the chips is contacted by at least one of the contact surfaces.

10. A cooling apparatus for a computer memory module comprising a substrate with memory chips on at least one surface thereof, at least one of the memory chips having a maximum preselected operating temperature, the cooling apparatus comprising:

a primary heat spreader having a longitudinal extent and comprising separate and discrete first and second panels configured to engage the memory module therebetween by assembling and securing the first and second panels together, the first and second panels having contact surfaces that face each other when the first and second panels are assembled and secured together and are adapted for thermal contact with the at least one memory chip of the computer memory module when the first and second panels are assembled and secured together with the computer memory module therebetween;

at least a first heatpipe fluidically coupled to the first panel of the primary heat spreader and having a remote portion alongside the first panel so as to be oriented substantially parallel to and spaced apart from the primary heat spreader in a lateral direction relative to the longitudinal extent of the primary heat spreader;

a secondary heat spreader in thermally conductive contact with the remote portion of the first heatpipe and spaced apart from the primary heat spreader so as to define an air gap therebetween, the secondary heat spreader comprising means for increasing surface dissipation of heat from the first heatpipe into the environment; and a coolant within the first heatpipe and within the primary heat spreader so as to absorb heat from the primary heat spreader while the coolant is within the first panel and conduct the absorbed heat to the secondary heat spreader by flowing from the first panel through the first heatpipe to the remote portion thereof, the coolant having a boiling point at or below the maximum preselected operating temperature of the at least one memory chip;

wherein a second portion of the first heatpipe is received within a groove recessed in the contact surface of the first panel, and a flat wall of the second portion of the first heatpipe is flush with the contact surface of the first panel and thermally contacts the at least one memory chip of the computer memory module when the first and second panels are assembled and secured together with the computer memory module therebetween.

11. The cooling apparatus according to claim 10, wherein the first and second panels are assembled and secured together and the cooling apparatus is installed on the memory module so that the memory module and the chips thereof are between the contact surfaces of the first and second panels and at least one of the chips is contacted by at least one of the contact surfaces.

12. A method of cooling a computer memory module, the method comprising installing the cooling apparatus of claim 10 on the memory module by assembling and securing the first and second panels together so that the memory module and the chips thereof are between the contact surfaces of the first and second panels and at least one of the chips is contacted by at least one of the contact surfaces.

13. A cooling apparatus for a computer memory module comprising a substrate with memory chips on at least one surface thereof, at least one of the memory chips having a maximum preselected operating temperature, the cooling apparatus comprising:

a primary heat spreader having a longitudinal extent and comprising separate and discrete first and second panels configured to engage the memory module therebetween by assembling and securing the first and second panels together, the first and second panels having contact surfaces that face each other when the first and second panels are assembled and secured together and are adapted for thermal contact with the at least one memory chip of the computer memory module when the first and second panels are assembled and secured together with the computer memory module therebetween;

at least a first heatpipe fluidically coupled to the first panel of the primary heat spreader and having a remote portion alongside the first panel so as to be oriented substantially parallel to and spaced apart from the primary heat spreader in a lateral direction relative to the longitudinal extent of the primary heat spreader;

a secondary heat spreader in thermally conductive contact with the remote portion of the first heatpipe and spaced apart from the primary heat spreader so as to define an air gap therebetween, the secondary heat spreader comprising means for increasing surface dissipation of heat from the first heatpipe into the environment; and a coolant within the first heatpipe and within the primary heat spreader so as to absorb heat from the primary heat spreader while the coolant is within the first panel and conduct the absorbed heat to the secondary heat spreader by flowing from the first panel through the first heatpipe to the remote portion thereof, the coolant having a boiling point at or below the maximum preselected operating temperature of the at least one memory chip;

wherein a second portion of the first heatpipe is received within a bore within the first panel, and the bore is not located at or beneath the contact surface of the first panel so that the second portion of the first heatpipe is adjacent and parallel to an edge of the computer memory module when the first and second panels are assembled and secured together with the computer memory module therebetween.

14. The cooling apparatus according to claim 13, wherein the first and second panels are assembled and secured together and the cooling apparatus is installed on the memory module so that the memory module and the chips thereof are between the contact surfaces of the first and second panels and at least one of the chips is contacted by at least one of the contact surfaces.

15. A method of cooling a computer memory module, the method comprising installing the cooling apparatus of claim 13 on the memory module by assembling and securing the first and second panels together so that the memory module and the chips thereof are between the contact surfaces of the first and second panels and at least one of the chips is contacted by at least one of the contact surfaces.

* * * * *

UNITED STATES PATENT AND TRADEMARK OFFICE
CERTIFICATE OF CORRECTION

PATENT NO. : 7,876,564 B2  
APPLICATION NO. : 12/127133  
DATED : January 25, 2011  
INVENTOR(S) : Mohasit Monh et al.

Page 1 of 1

It is certified that error appears in the above-identified patent and that said Letters Patent is hereby corrected as shown below:

(73) Assignee: Please delete "CCZ Technology Group, Inc." and substitute therefor --OCZ Technology Group, Inc., San Jose, CA (US)--

Signed and Sealed this
Fifteenth Day of March, 2011

David J. Kappos
*Director of the United States Patent and Trademark Office*